(12) United States Patent
Choi

(10) Patent No.: US 11,527,427 B2
(45) Date of Patent: Dec. 13, 2022

(54) SEMICONDUCTOR PROCESSING APPARATUS AND SEMICONDUCTOR PROCESSING SYSTEM

(71) Applicant: Samsung Electronics Co., Ltd., Suwon-si (KR)

(72) Inventor: Hyun Ho Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 16/440,247

(22) Filed: Jun. 13, 2019

(65) Prior Publication Data

US 2020/0168494 A1 May 28, 2020

(30) Foreign Application Priority Data

Nov. 27, 2018 (KR) .................. 10-2018-0148236

(51) Int. Cl.
*H01L 21/677* (2006.01)
*C23C 16/455* (2006.01)
*C23C 16/44* (2006.01)
*H01L 21/02* (2006.01)

(52) U.S. Cl.
CPC .... *H01L 21/67757* (2013.01); *C23C 16/4409* (2013.01); *C23C 16/4412* (2013.01); *C23C 16/45544* (2013.01); *C23C 16/45578* (2013.01); *H01L 21/0262* (2013.01)

(58) Field of Classification Search
None
See application file for complete search history.

(56) References Cited

U.S. PATENT DOCUMENTS

| | | | |
|---|---|---|---|
| 5,320,680 A * | 6/1994 | Learn | C23C 16/45514 118/724 |
| 5,503,678 A * | 4/1996 | Usami | C23C 16/45589 118/724 |
| 7,151,686 B2 | 12/2006 | Sugimae et al. | |
| 2002/0056414 A1* | 5/2002 | Shim | C23C 16/4401 118/724 |
| 2005/0039686 A1* | 2/2005 | Zheng | C23C 16/4583 118/728 |
| 2006/0110533 A1 | 5/2006 | Hwang et al. | |
| 2009/0311873 A1* | 12/2009 | Wang | H01L 21/67109 438/758 |
| 2010/0212593 A1* | 8/2010 | Takebayashi | C23C 16/45578 118/725 |
| 2015/0267296 A1* | 9/2015 | Nishida | H01L 21/0214 118/704 |

FOREIGN PATENT DOCUMENTS

| | | | |
|---|---|---|---|
| JP | H 5198517 A | | 8/1993 |
| JP | 2011238832 A | * | 11/2011 |
| KR | 100636037 B1 | | 10/2006 |

(Continued)

*Primary Examiner* — Karla A Moore
(74) *Attorney, Agent, or Firm* — Harness, Dickey & Pierce, P.L.C.

(57) ABSTRACT

A semiconductor processing apparatus may include a processing part including a cavity, an insertion part configured to be inserted in the cavity, and a gas inlet coupled to the processing part and configured to supply a gas into the cavity. The insertion part may include a container and a gas ejection pipe facing the container.

19 Claims, 13 Drawing Sheets

(56) References Cited

FOREIGN PATENT DOCUMENTS

| KR | 101108576 B1 | 1/2012 |
| KR | 101108579 B1 | 1/2012 |
| KR | 101295790 B1 | 8/2013 |
| KR | 101462259 B1 | 11/2014 |
| KR | 101573526 B1 | 12/2015 |
| KR | 101717482 B1 | 3/2017 |

* cited by examiner

SEMICONDUCTOR PROCESSING APPARATUS AND SEMICONDUCTOR PROCESSING SYSTEM

CROSS-REFERENCE TO RELATED APPLICATIONS

This U.S. non-provisional patent application claims priority under 35 U.S.C. § 119 to Korean Patent Application No. 10-2018-0148236, filed on Nov. 27, 2018, in the Korean Intellectual Property Office, the entire contents of which are hereby incorporated by reference.

BACKGROUND OF THE INVENTION

The present disclosure relates to semiconductor processing apparatuses and/or semiconductor processing systems, and in particular, to semiconductor processing apparatuses, in which a gas ejection pipe is coupled to an insertion part, and/or semiconductor processing systems including the same.

To fabricate a semiconductor device, a processing apparatus is used to perform various processes. Recently, a vertical-type semiconductor processing apparatus capable of simultaneously processing a plurality of wafers is being used. Such a semiconductor processing apparatus is referred to as a vertical furnace.

A conventional vertical-type semiconductor processing apparatus may be used to perform a process on several to several hundred wafers, which are vertically stacked, at the same time. A gaseous material may be ejected into a semiconductor processing apparatus, in which a plurality of wafers are stacked. The gaseous material may be ejected using a nozzle or the like. The ejected gaseous material may be used for various processes to be performed on the wafer. For example, the semiconductor processing apparatus may be used to perform a CAP or an atomic layer deposition (ALD) process. During the process, an internal space of the semiconductor processing apparatus should be isolated from the outside.

SUMMARY

Some example embodiments of the inventive concepts provide a semiconductor processing apparatuses, which allow an easy alignment of a gas ejection pipe, and/or semiconductor processing systems including the same.

Some example embodiments of the inventive concepts provide semiconductor processing apparatuses, which are configured to mitigate or prevent a harmful gaseous material from being leaked, and/or semiconductor processing systems including the same.

Some example embodiments of the inventive concepts provide semiconductor processing apparatuses, which allow an easy replacement of a gas ejection pipe, and/or semiconductor processing systems including the same.

According to an example embodiment of the inventive concepts, a semiconductor processing apparatus includes a processing part including a cavity, an insertion part configured to be inserted in the cavity, and a gas inlet coupled to the processing part and configured to supply a gas into the cavity. The insertion part may include a container and a gas ejection pipe facing the container.

According to an example embodiment of the inventive concepts, a semiconductor processing apparatus includes a processing part providing a cavity, an insertion part configured to be inserted in the cavity, and a coupling part coupled to the processing part and including a gas inlet. The insertion part may include a container and a gas ejection pipe facing the container.

According to an example embodiment of the inventive concepts, a semiconductor processing system includes a semiconductor processing apparatus and a housing configured to accommodate the semiconductor processing apparatus therein. The semiconductor processing apparatus may include a processing part including a cavity, an insertion part configured to be inserted in the cavity, and a gas inlet coupled to the processing part and configured to supply a gas into the cavity. The insertion part may include a container and a gas ejection pipe facing the container.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate some general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by the example embodiments disclosed herein. For example, relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
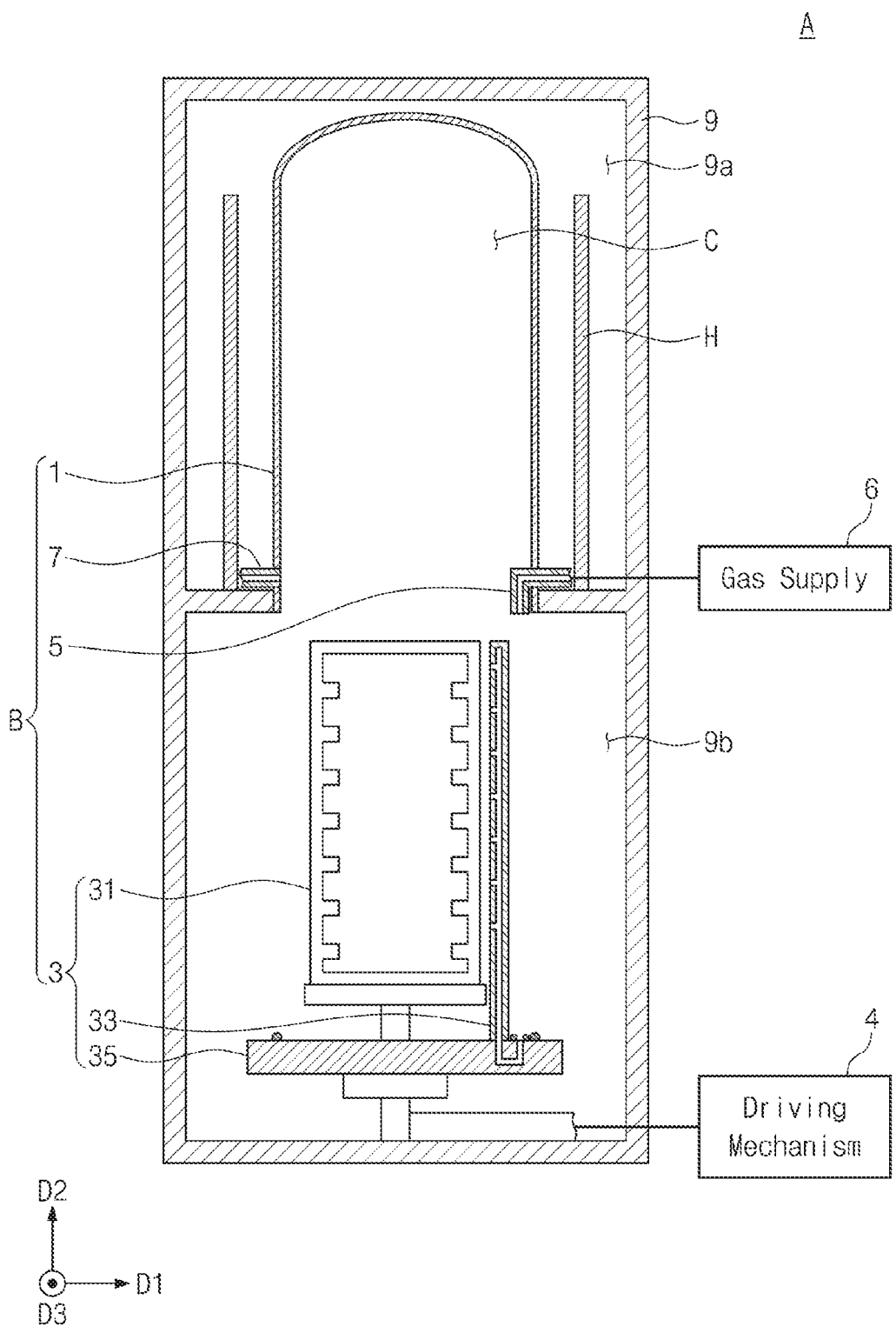
FIG. 1 is a sectional view illustrating a semiconductor processing apparatus and a semiconductor processing system according to an example embodiment of the inventive concepts.

FIG. 1 is a sectional view illustrating a semiconductor processing apparatus and a semiconductor processing system according to an example embodiment of the inventive concepts.

In the following description, rightward and upward directions in FIG. 1 will be referred to as a first direction D1 and a second direction D2, respectively, and a page-exiting direction, which is perpendicular to both the first direction D1 and the second direction D2, will be referred to as a third direction D3.

Referring to FIG. 1, a semiconductor processing system A may include a semiconductor processing apparatus B, a housing 9, a heater H, a driving mechanism 4, and a gas supply 6.

The semiconductor processing apparatus B may include a processing part 1, an insertion part 3, a gas inlet 5, and an exhaust 7.

The processing part 1 may be a partly-opened chamber. A cavity C may be provided in the processing part 1. The insertion part 3 may be inserted in the cavity C. When the insertion part 3 may be inserted in the cavity C, a process in the processing part 1 may be performed. In some example embodiments, the processing part 1 may include quartz and the like. In some example embodiments, the semiconductor processing system A may include a plurality of the processing parts 1. The plurality of the processing parts 1 may be overlapped with each other. For example, a smaller processing part may be disposed in a larger processing part.

The insertion part 3 may be inserted in the cavity C of the processing part 1. The insertion part 3 may be configured to be movable in the second direction D2 and an opposite direction of the second direction D2. The insertion part 3 may include a container 31, a gas ejection pipe 33, and a support 35. The container 31 may be configured to contain a wafer W (alternatively referred to as a semiconductor substrate) (e.g., see FIG. 3). The gas ejection pipe 33 may be configured to eject a gaseous material (interchangeably referred to as a gas) toward the container 31. The support 35 may be configured to support the container 31 and the gas ejection pipe 33 and change positions of the container 31 and the gas ejection pipe 33.

The gas inlet 5 may be coupled to the processing part 1. The gas inlet 5 may pass through a portion of the processing part 1. The gas inlet 5 may supply a gaseous material into the cavity C.

The exhaust 7 may pass through another portion of the processing part 1. The exhaust 7 may be provided in the form of a pipe. The exhaust 7 may fluidically connect the cavity C to the outside. The exhaust 7 may exhaust a gaseous material in the cavity C to the outside. These will be described in more detail below.

The housing 9 may be provided to enclose the semiconductor processing apparatus B. The housing 9 may include a first chamber 9a and a second chamber 9b. The processing part 1 may be placed in the first chamber 9a. The second chamber 9b may be located below the first chamber 9a. A portion or the entirety of the insertion part 3 may be placed in the second chamber 9b. The first chamber 9a and the second chamber 9b may be isolated from the outside by the housing 9.

The heater H may be placed in the first chamber 9a. The heater H may be disposed beside the processing part 1. The heater H may be used to heat the processing part 1.

The driving mechanism 4 may be connected to the insertion part 3. For example, the driving mechanism 4 may be connected to the support 35 of the insertion part 3. The driving mechanism 4 may be configured to change a position of the insertion part 3. In some example embodiments, the driving mechanism 4 may move the insertion part 3 in the second direction D2 and/or the first direction D1. The driving mechanism 4 may include a motor or the like. However, the inventive concepts are not limited to this example, and the driving mechanism 4 may include another driving element capable of changing a positon of the insertion part 3.

The gas supply 6 may be connected to the gas inlet 5. The gas supply 6 may supply a process gas or the like to the gas inlet 5. In some example embodiments, the gas supply 6 may include a pump or the like. A gaseous material supplied in the gas inlet 5 may be provided in the cavity C through the gas ejection pipe 33.

Figure 2:
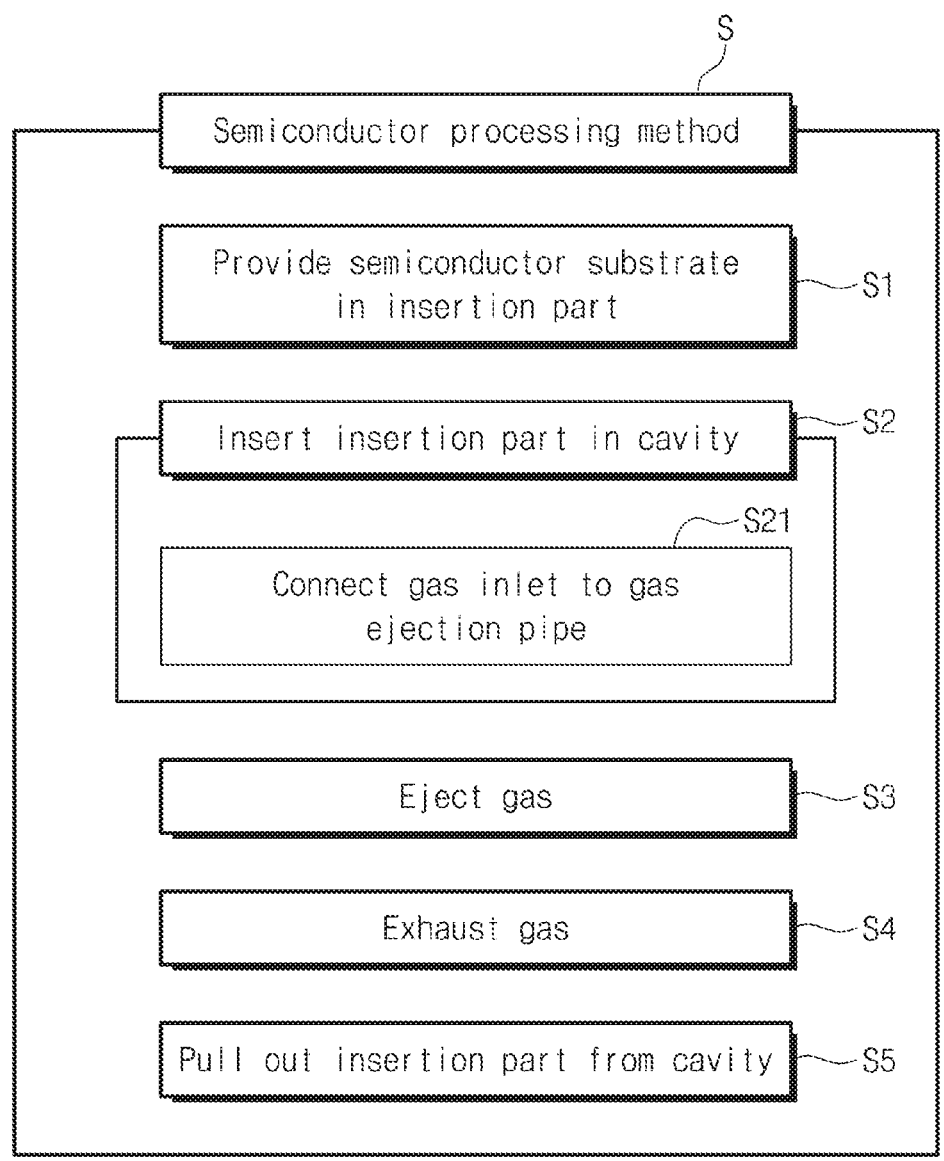
FIG. 2 is a flow chart illustrating a semiconductor processing method according to an example embodiment of the inventive concepts.

FIG. 2 is a flow chart illustrating a semiconductor processing method according to an example embodiment of the inventive concepts.

Referring to FIG. 2, a semiconductor processing method S may include providing a semiconductor substrate in an insertion part (S1), inserting or disposing the insertion part in a cavity (S2), ejecting a gas (S3), exhausting the gas (S4), and pulling out the insertion part from the cavity (S5). The disposing of the insertion part in the cavity (S2) may further include fluidically connecting a gas inlet to a gas ejection pipe (S21). These steps of the method will be described in more detail with reference to FIGS. 3 to 12.

Figure 3:
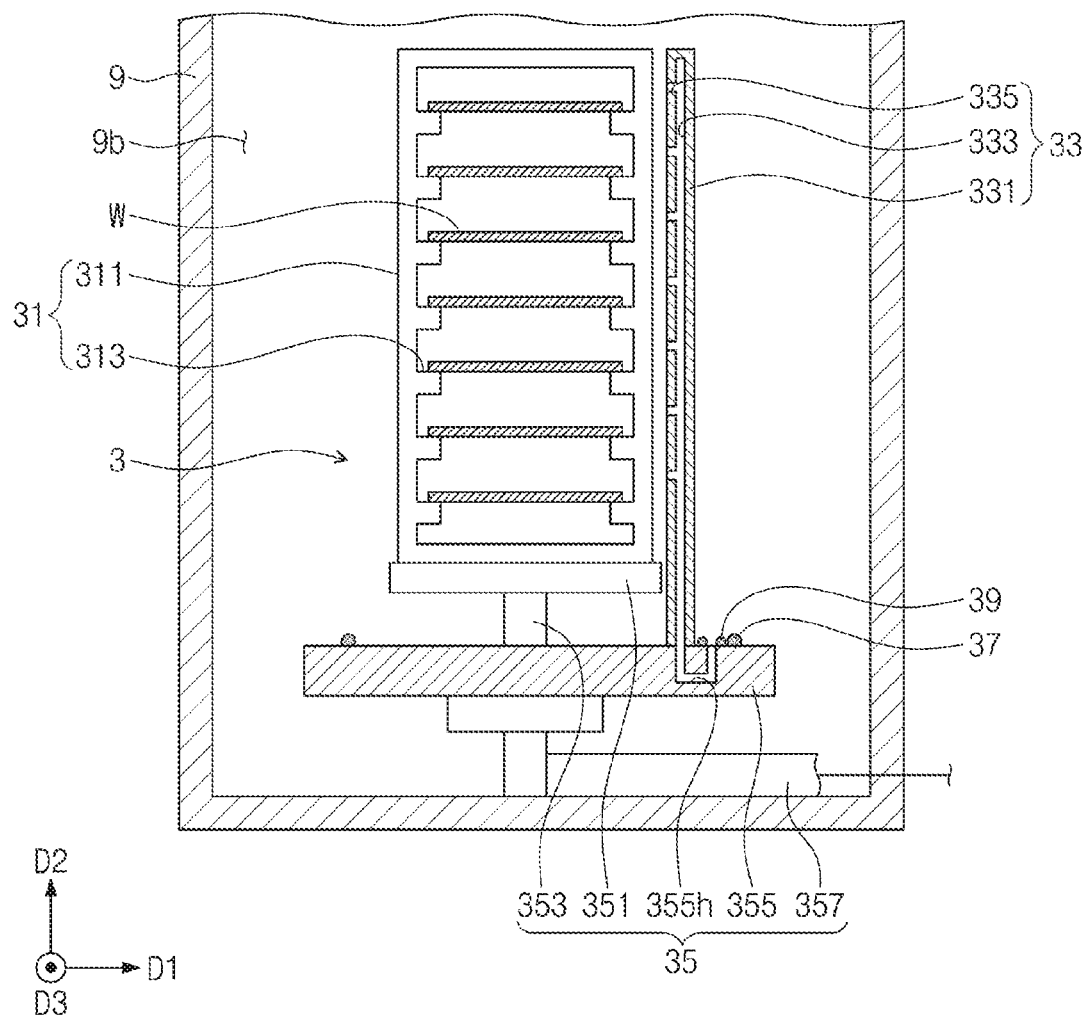
FIG. 3 is an enlarged sectional view illustrating a second chamber of a semiconductor processing system according to an example embodiment of the inventive concepts.

FIG. 3 is an enlarged sectional view illustrating a second chamber of a semiconductor processing system according to an example embodiment of the inventive concepts.

Referring to FIG. 3, the insertion part 3 may be located in the second chamber 9b. The insertion part 3 may include a body 311 and a receiving strut 313. In some example embodiments, the body 311 may be a partly-opened rectangular structure. The receiving strut 313 may be located inside the body 311. The receiving strut 313 may protrude from an inner side surface of the body 311 in an inward direction. An object to which a process will be performed, may be mounted on the receiving strut 313. In some example embodiments, the object may include a wafer W or a semiconductor substrate. In an example embodiment, a plurality of the receiving struts 313 may be provided. The receiving strut 313 may be arranged in the second direction D2. Thus, in the insertion part 3, a plurality of wafers W may be arranged in the second direction D2. In some example embodiments, the insertion part 3 may be configured to contain 50 to 150 wafers W. However, the inventive concepts are not limited to this example, and a single receiving strut and a single object mounted on the receiving strut may be provided.

The gas ejection pipe 33 may include a body 331, a transfer hole 333, and an ejection hole 335. The body 331 may be extended from the support 35 in the second direction D2. The body 331 may have a rectangular shape or a circular pillar shape, but the inventive concepts are not limited to a specific shape of the body 331. The transfer hole 333 may be an empty space, which is formed in the body 331. The transfer hole 333 may extend from the support 35 in the second direction D2. The ejection hole 335 may extend from the transfer hole 333 in an opposite direction of the first direction D1. The ejection hole 335 may be directed toward the container 31. In other words, the ejection hole 335 may be an opening that is fluidically connected to the transfer hole 333 and directed toward the container 31. In some example embodiments, a plurality of the ejection holes 335 may be provided. For example, the ejection holes 335 may be arranged to be directed toward a plurality of receiving struts 313, respectively.

The support 35 may include a supporting member 351, a connecting member 353, a supporting plate 355, and a driving member 357. The supporting member 351 may support the container 31. The supporting member 351 may have a plate shape. The connecting member 353 may extend from a bottom surface of the supporting member 351 in an opposite direction of the second direction D2. The supporting plate 355 may support the connecting member 353. A connecting hole 355h may be provided in the supporting plate 355. The connecting hole 355h may be fluidically connected to the transfer hole 333 of the gas ejection pipe 33. The connecting hole 355h may have a bent shape. The driving member 357 may be connected to the supporting plate 355. The driving member 357 may be connected to the driving mechanism 4 (e.g., see FIG. 1). The driving member 357 may be moved by the driving mechanism. In some example embodiments, the driving member 357 may be movable in the second direction D2 and/or the first direction D1. In the case where the driving member 357 moves, the entirety of the insertion part 3 may move.

The semiconductor processing apparatus may further include a first sealing member 37 and a second sealing member 39. The first sealing member 37 may be provided on the support 35. For example, the first sealing member 37 may be provided on the supporting plate 355. When the insertion part 3 is inserted in the cavity C, the first sealing member 37 may be in contact with the processing part 1 to isolate the cavity C from the second chamber 9b. The first sealing member 37 may include an elastic object. In some example embodiments, the first sealing member 37 may include an O-ring. The first sealing member 37 may be provided to enclose an edge portion of the supporting plate 355. The second sealing member 39 may be provided on the support 35. For example, the second sealing member 39 may be provided on the supporting plate 355. When the insertion part 3 is inserted in the cavity C, the second sealing member 39 may be in close contact with the gas inlet 5. The second sealing member 39 may include an elastic object. In some example embodiments, the second sealing member 39 may include an O-ring. The second sealing member 39 may be provided to enclose an entrance portion of the connecting hole 355h. The first sealing member 37 and the second sealing member 39 will be described in more detail below.

Figure 4:
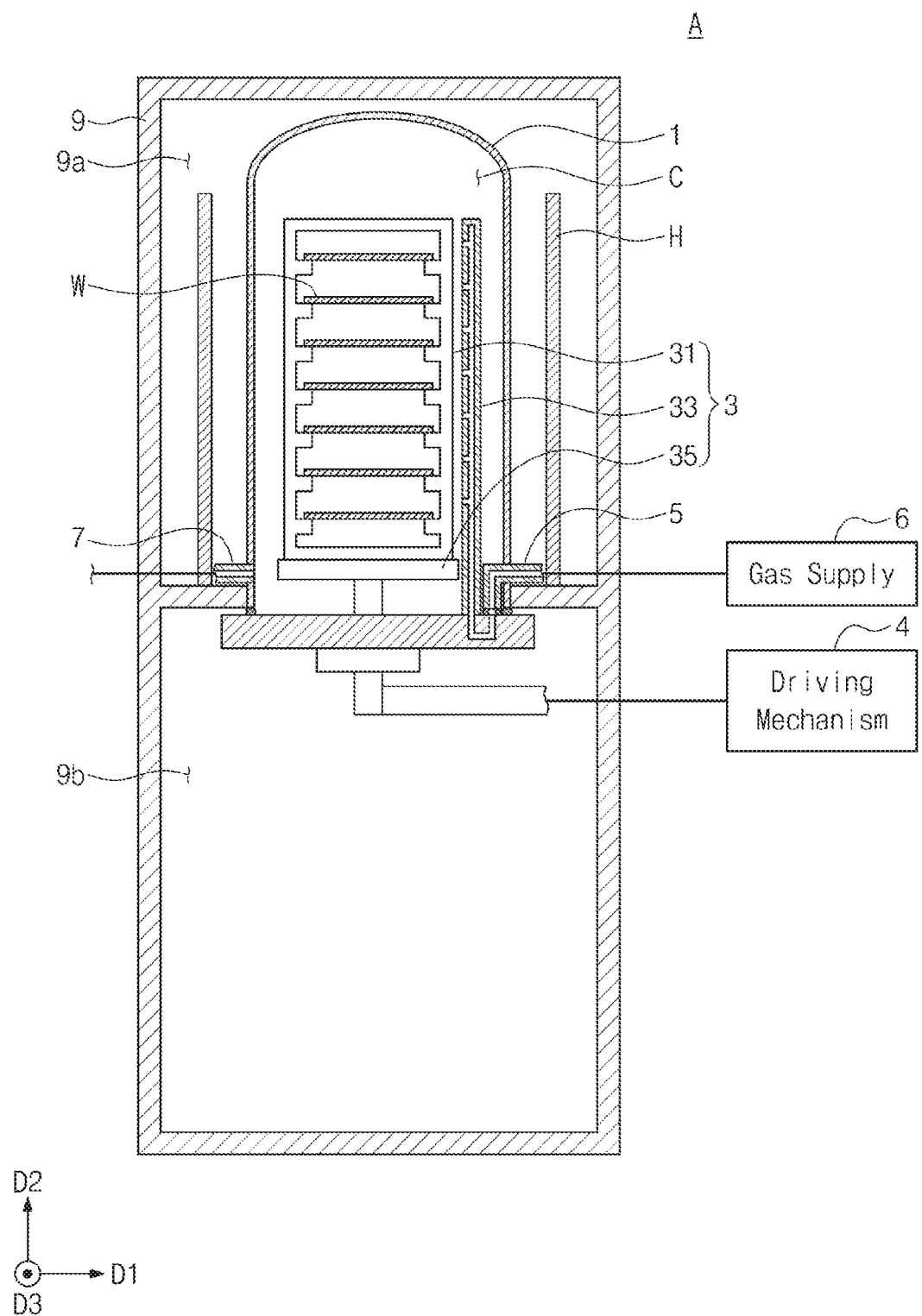
FIG. 4 is a sectional view illustrating a process of operating a semiconductor processing system according to an example embodiment of the inventive concepts.
Figure 5:
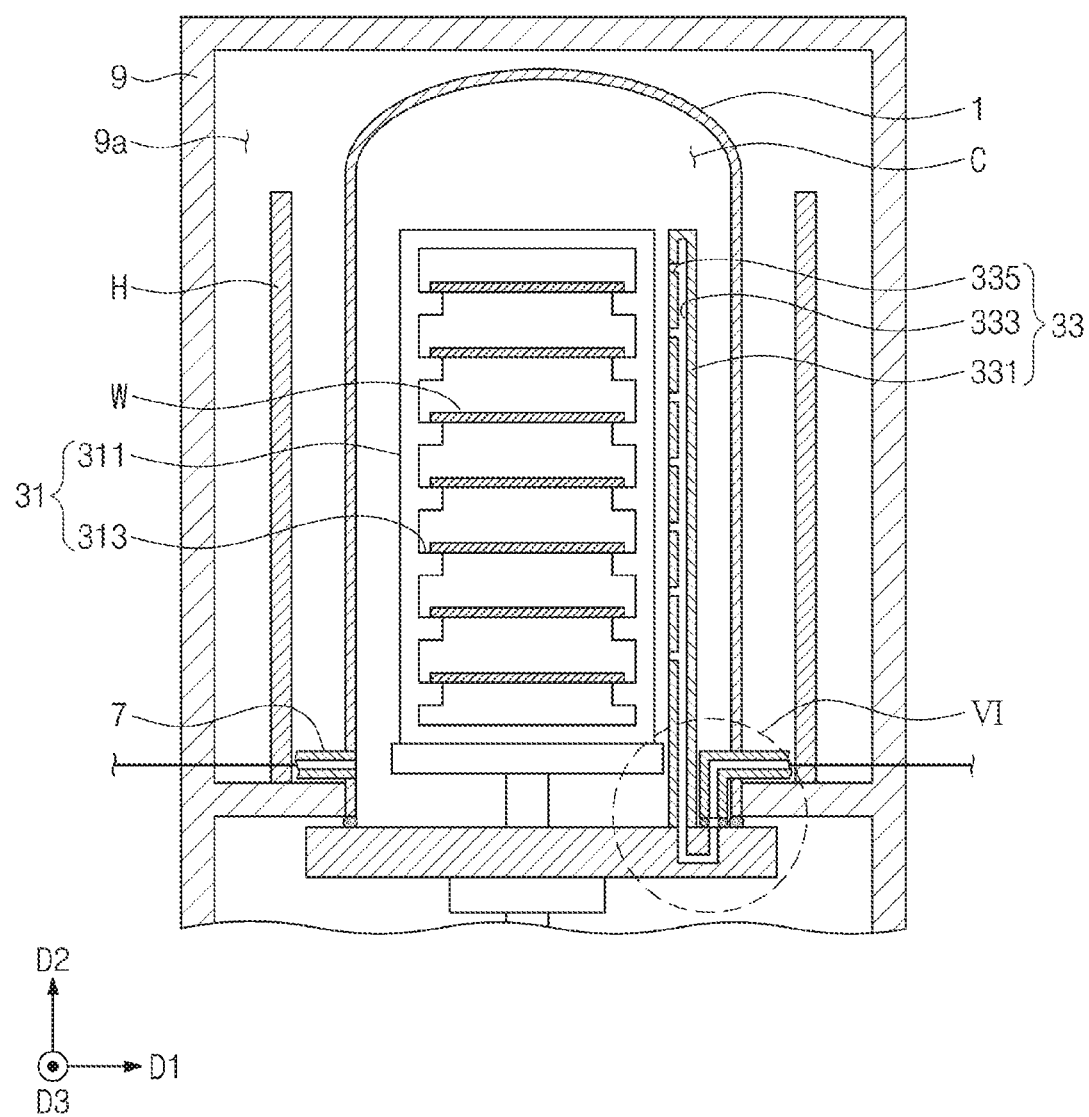
FIG. 5 is an enlarged sectional view illustrating a first chamber of a semiconductor processing system according to an example embodiment of the inventive concepts.

FIG. 4 is a sectional view illustrating a process of operating a semiconductor processing system according to an example embodiment of the inventive concepts, and FIG. 5 is an enlarged sectional view illustrating a first chamber of a semiconductor processing system according to an example embodiment of the inventive concepts.

Referring to FIG. 4, in the inserting of the insertion part in the cavity (in S2), the driving mechanism 4 may move the insertion part 3 in the second direction D2. The insertion part 3 may be moved in the second direction D2 and may be inserted in the cavity C. In the connecting of the gas inlet and the gas ejection pipe 33 (in S21), the gas inlet 5 may be connected to the gas ejection pipe 33. In the present specification, the expression 'an element is connected to another element' may be used to represent a direct connection (e.g., by direct contact) and/or an indirect connection (e.g., via another element) between two elements.

FIGS. 6A to 6D are enlarged sectional views illustrating a portion 'VI' of the semiconductor processing system of FIG. 5.

Figure 6A:
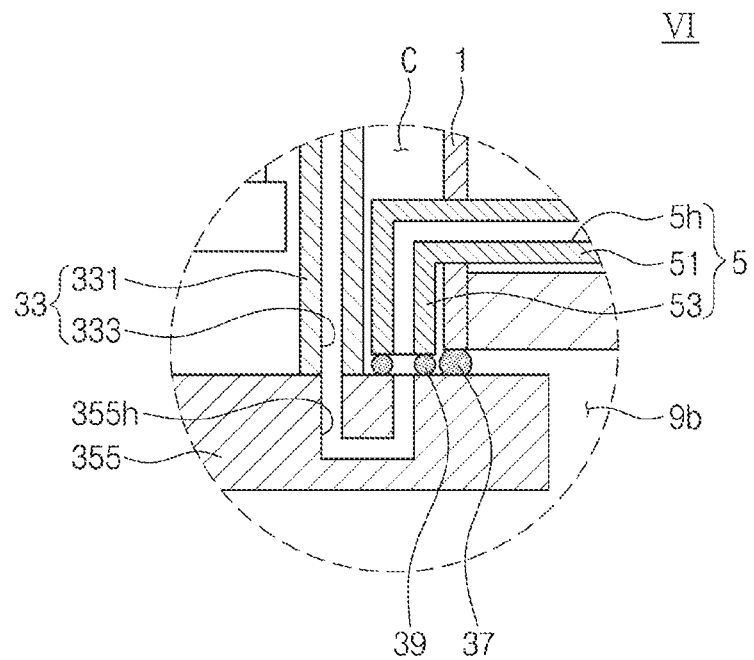
FIGS. 6A to 6D are enlarged sectional views illustrating a portion 'VI' of the semiconductor processing system of FIG. 5.

Referring to FIGS. 5 and 6A, the processing part 1 may be in contact with the first sealing member 37. In some example embodiments, the first sealing member 37 may be in contact with a bottom surface of the processing part 1. The first sealing member 37 may be compressed. The cavity C in the processing part 1 may be isolated from the second chamber 9b by the first sealing member 37. In the present specification, the expression 'a region is isolated from another region' may mean that two region are separated from each other to prevent a gaseous material from being leaked therethrough.

The gas inlet 5 may be a pipe-shaped structure that is provided to pass through a portion of the processing part 1. In some example embodiments, the gas inlet 5 may include a first member 51 extending in the first direction D1 and a second member 53 extending in the second direction D2. The gas inlet 5 may include an inflow hole 5h. In the first member 51 and the second member 53, the inflow hole 5h may extend in the first direction D1 and the second direction D2.

The gas inlet 5 may be in contact with the second sealing member 39. For example, the second sealing member 39 may be in contact with a bottom surface of the second member 53. The second sealing member 39 may be compressed. The inflow hole 5h in the gas inlet 5 may be isolated from the cavity C by the second sealing member 39.

The inflow hole 5h in the gas inlet 5 may be fluidically connected to the transfer hole 333 in the gas ejection pipe 33. In the present specification, the expression 'a region is (fluidically) connected to another region' may mean that two regions are directly or indirectly connected to each other to allow a gaseous material to flow therethrough. In some example embodiments, the inflow hole 5h in the gas inlet 5 may be connected to the connecting hole 355h of the supporting plate 355. The connecting hole 355h may be connected to the transfer hole 333. The inflow hole 5h may be fluidically connected to the transfer hole 333 through the connecting hole 355h.

Figure 6B:
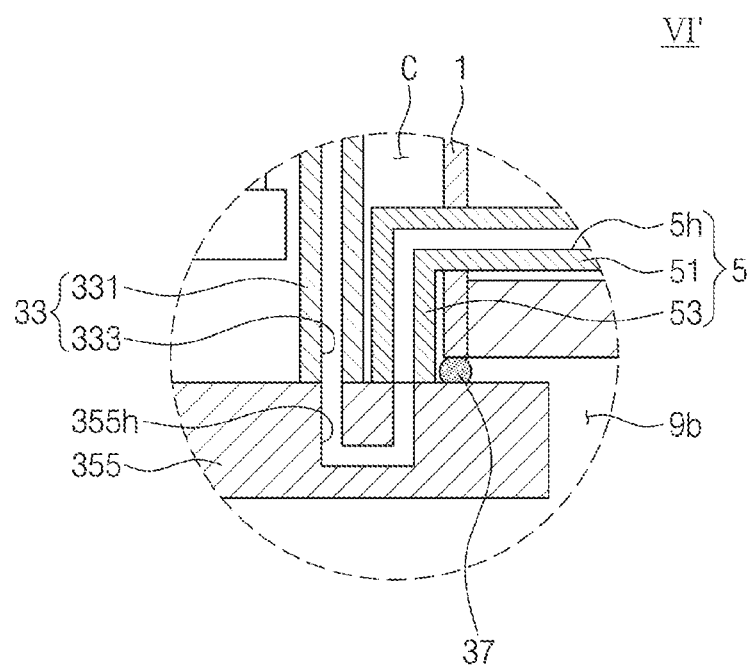

Referring to FIGS. 5 and 6B, the gas inlet 5 may be connected to the supporting plate 355. For example, a bottom surface of the second member 53 may be in contact with a top surface of the supporting plate 355. The inflow hole 5h may be connected to the connecting hole 355h.

Figure 6C:
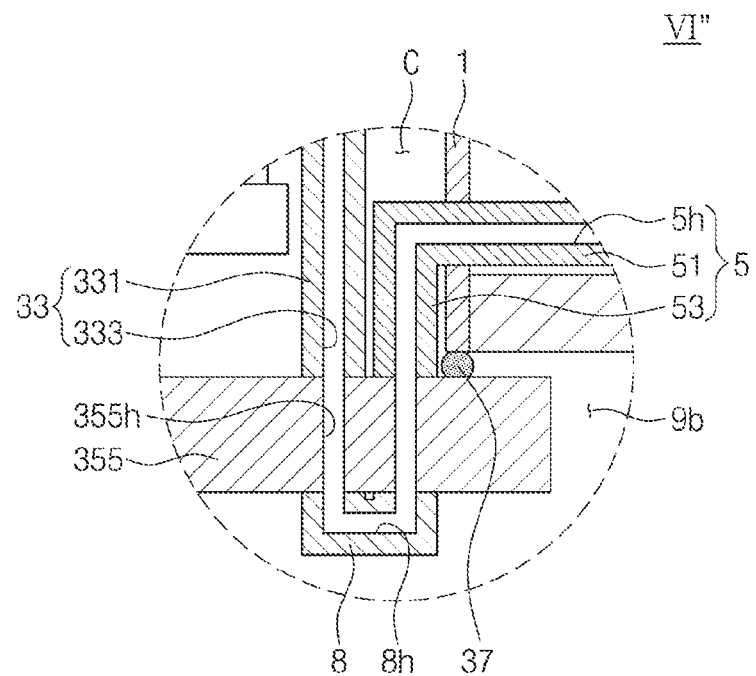

Referring to FIGS. 5 and 6C, two connecting holes 355h may be provided. The semiconductor processing apparatus may further include an extended portion 8. The extended portion 8 may be provided on a bottom surface of the supporting plate 355. An extension hole 8h may be in the extended portion 8. In some embodiments, the extension hole 8h may have a bent shape. The extension hole 8h may connect the two connecting holes 355h to each other. The inflow hole 5h may be fluidically connected to the transfer hole 333 through the connecting holes 355h and the extension hole 8h. In some example embodiments, the extended portion 8 may be detached from the supporting plate 355. For example, the extended portion 8 may be detached from the supporting plate 355, when it is desired to perform a cleaning process on the extension hole 8h and/or the connecting hole 355h.

Figure 6D:
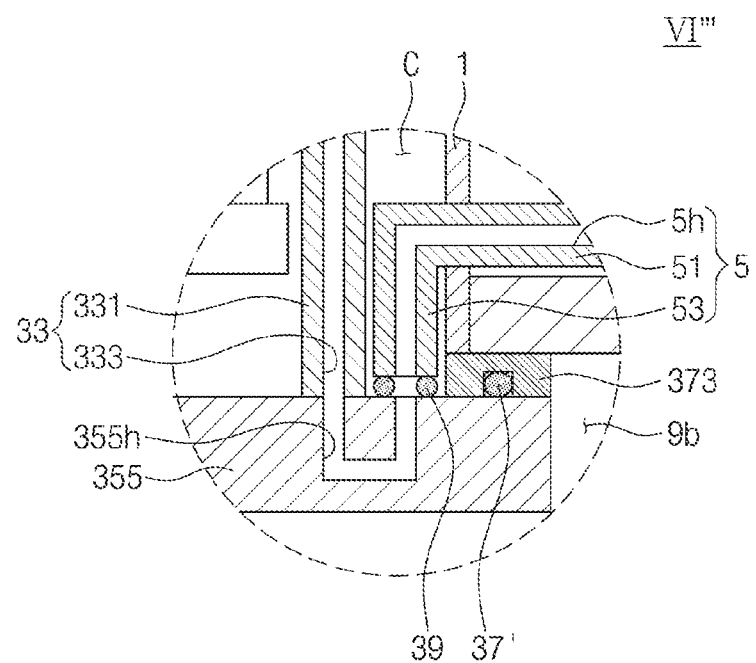

Referring to FIGS. 5 and 6D, the semiconductor processing apparatus may further include a sealing member containing part 373. A bottom surface of the sealing member containing part 373 may be in contact with a top surface of the supporting plate 355. The sealing member containing part 373 may provide a space, in which a sealing member 37' can be contained. The sealing member 37' may be contained in the sealing member containing part 373. The cavity C may be isolated from the second chamber 9b by the sealing member containing part 373 and the sealing member 37'.

Figure 7:
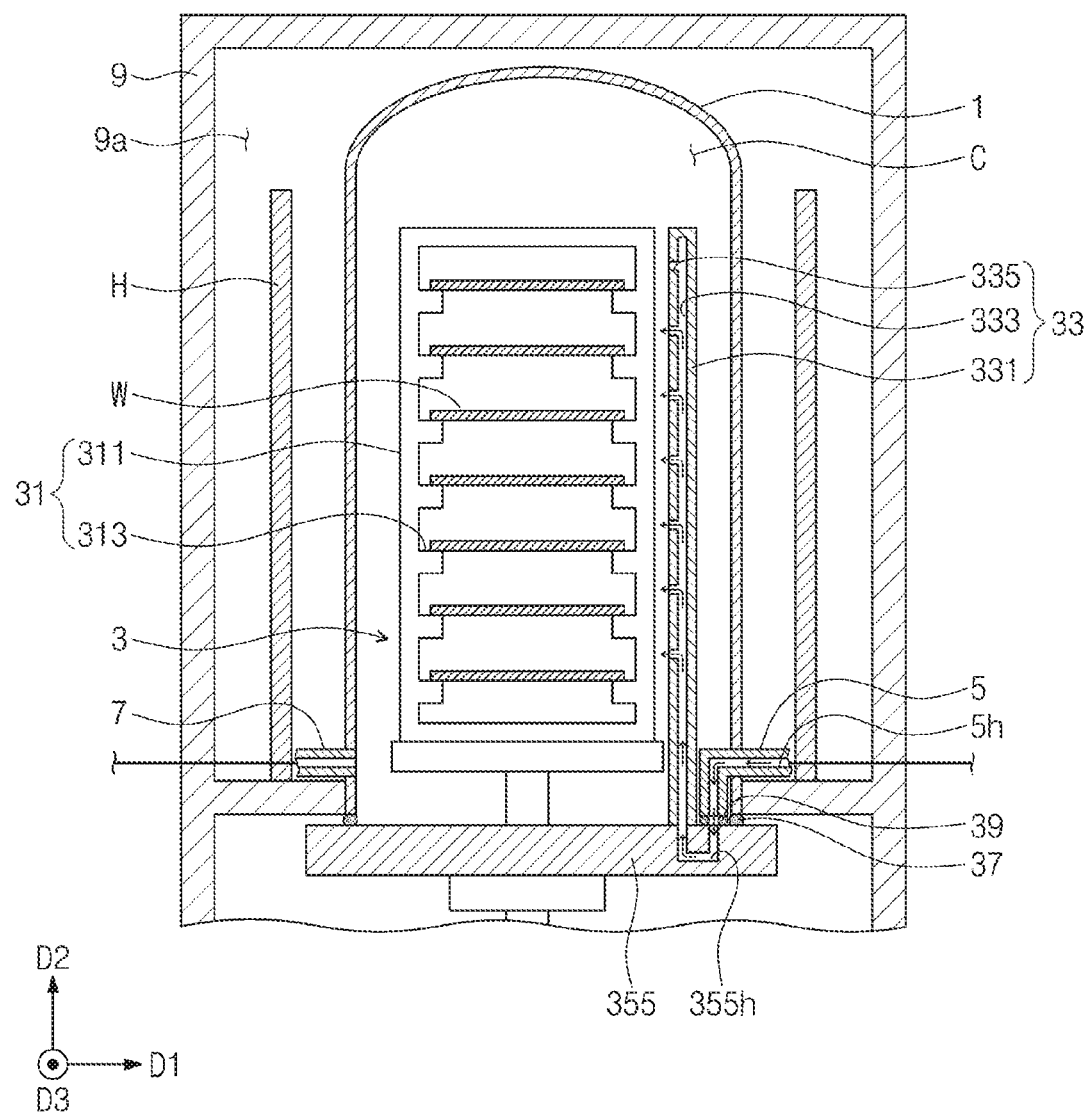
FIG. 7 is a sectional view exemplarily illustrating a gas flow in a first chamber of a semiconductor processing system according to an example embodiment of the inventive concepts.

FIG. 7 is a sectional view exemplarily illustrating a gas flow in a first chamber of a semiconductor processing system according to an example embodiment of the inventive concepts.

Referring to FIG. 7, in the ejecting of the gas (S3), a gaseous material, which is supplied from the gas supply, may be provided into the gas inlet 5. The gaseous material may be transported into the transfer hole 333 through the gas inlet 5 and the connecting hole 355h. The gaseous material may be transported along the transfer hole 333 in the second direction D2 and may be ejected from the gas ejection pipe 33 through the ejection hole 335 in a direction opposite to the first direction D1. The gaseous material ejected through the ejection hole 335 may be provided onto the wafer W mounted on the receiving strut. In a deposition process, the gaseous material may be deposited on a surface of the wafer W. In some embodiments, the deposition process may include a CAP process, an atomic layer deposition (ALD) process, or the like. However, the inventive concepts are not limited to these examples, and the processing part may be used to perform various other processes.

If the process is finished, the exhausting of the gas (S4) may be performed to exhaust the gaseous material in the processing part 1 and the housing 9 to the outside through the exhaust 7. In some example embodiments, to exhaust the gaseous material, an inert gas may be supplied into the cavity C through the gas inlet 5. The inert gas may be a nitrogen (N₂) gas. However, the inventive concepts are not limited to this example, and other gas may be used to exhaust the gaseous material from the processing part 1 and the housing 9. By using the inert gas, it may be possible to more effectively exhaust a process gas from the processing part 1 and the housing 9. In this case, a gaseous material remaining in the first chamber may not be harmful to a human body.

If the process gas is removed from the cavity C, the insertion part 3 may be pulled out from the cavity C (in S5). In some example embodiments, the insertion part 3 may move in the opposite direction of the second direction D2 by the driving mechanism 4. The first and second sealing members 37 and 39 and the processing part 1 may be in contact with each other no longer. The insertion part 3 may be returned to the second chamber 9b. A gaseous material in the second chamber 9b connected to the first chamber 9a may not be harmful to the human body.

Figure 8:
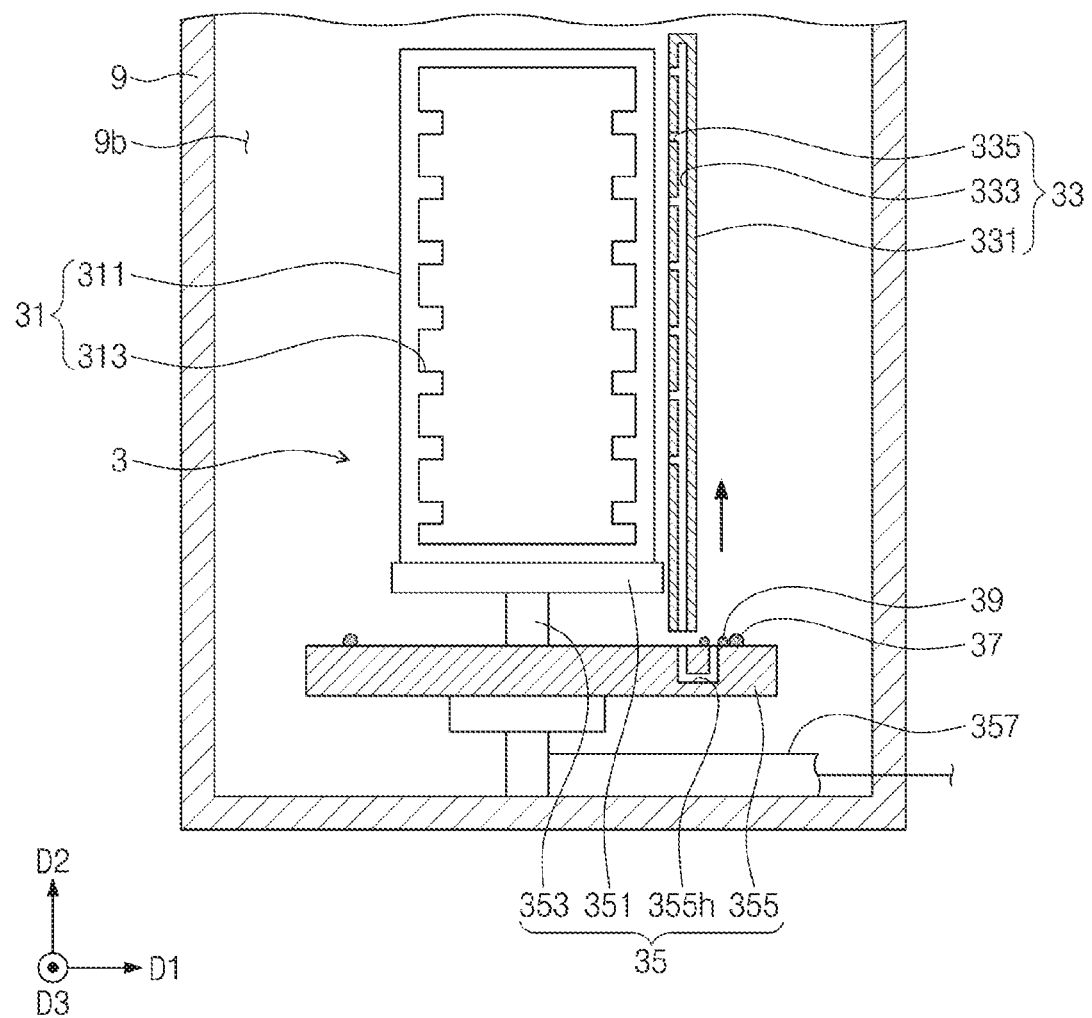
FIG. 8 is a sectional view illustrating a semiconductor processing system, from which a gas ejection pipe is separated, according to an example embodiment of the inventive concepts.

FIG. 8 is a sectional view illustrating a semiconductor processing system, from which a gas ejection pipe is separated, according to an example embodiment of the inventive concepts.

Referring to FIG. 8, when the insertion part 3 is disposed in the second chamber 9b, the gas ejection pipe 33 may be detachable from the supporting plate 355. The gas ejection pipe 33 may be replaced with another pipe. The transfer hole 333 and/or the ejection hole 335 of the gas ejection pipe 33 may be easily cleaned. Alignment between the gas ejection pipe 33 and the supporting plate 355 may be easily adjusted. A position of the gas ejection pipe 33 may be adjusted such that the ejection hole 335 is precisely aligned to a desired position in the cavity C. An alignment state of the gas ejection pipe 33 may be easily inspected.

In the semiconductor processing system according to an example embodiment of the inventive concepts, an alignment state of the gas ejection pipe may be easily examined when the insertion part is in the second chamber 9b. Thus, it may be possible to more precisely place the ejection hole 335 to a desired position in the cavity. In some example embodiments, a gaseous material ejected through the ejection hole 335 may be ejected to be substantially perpendicular to the gas ejection pipe 33. A gaseous material ejected through the ejection hole 335 may be precisely ejected onto a desired position of a wafer. The gaseous material may be deposited on the wafer to have a more uniform thickness. Accuracy and uniformity of the process may be improved. Thus, it may be possible to reduce a process variation from wafer to wafer and to increase a process yield. Furthermore, an operator may directly inspect and adjust an alignment state of the gas ejection pipe 33 with relative ease. Thus, the operation or process may be more quickly performed. It may be possible to secure the safety of the operator during the operation or process.

In the semiconductor processing system according to an example embodiment of the inventive concepts, the gas ejection pipe 33 may be separated from the support 35. The gas ejection pipe 33 may be contaminated by a gaseous material passing through the same, and in this case, it is desired to perform an operation of cleaning or replacing the gas ejection pipe 33. According to an example embodiment of the inventive concepts, the gas ejection pipe 33 may be separated from the support 35 by an operator and may be cleaned and/or replaced with ease. Thus, the gas ejection pipe 33 may be maintained to be in a clean state with a relative ease. It may be possible to improve an operational efficiency and a process accuracy. Thus, it may be possible to improve a process yield.

In the semiconductor processing system according to an example embodiment of the inventive concepts, although the gas ejection pipe 33 is included in the insertion part 3, the gas inlet 5 may be coupled to the processing part 1. The processing part 1 may be fixed to a specific position. Thus, the gas inlet 5 may also be fixed to a specific position. The gas supply 6 may also be fixed to a specific position. Since the parts, which are used to supply a harmful material contained in the process gas, are fixed to specific positions, it may be possible to mitigate or prevent such parts from being damaged and mitigate or prevent the process gas or the harmful material therein from being leaked. Thus, the safety of an operator can be secured.

Even when the insertion part 3 is inserted in the processing part 1, the ejection hole 335 of the gas ejection pipe 33 and the inflow hole 5h of the gas inlet 5 may be connected to each other. Thus, a process of supplying a gaseous material may be more effectively performed. Furthermore, it may be possible to mitigate or prevent the gaseous material from being leaked, due to the first and second sealing members 37 and 39.

Figure 9:
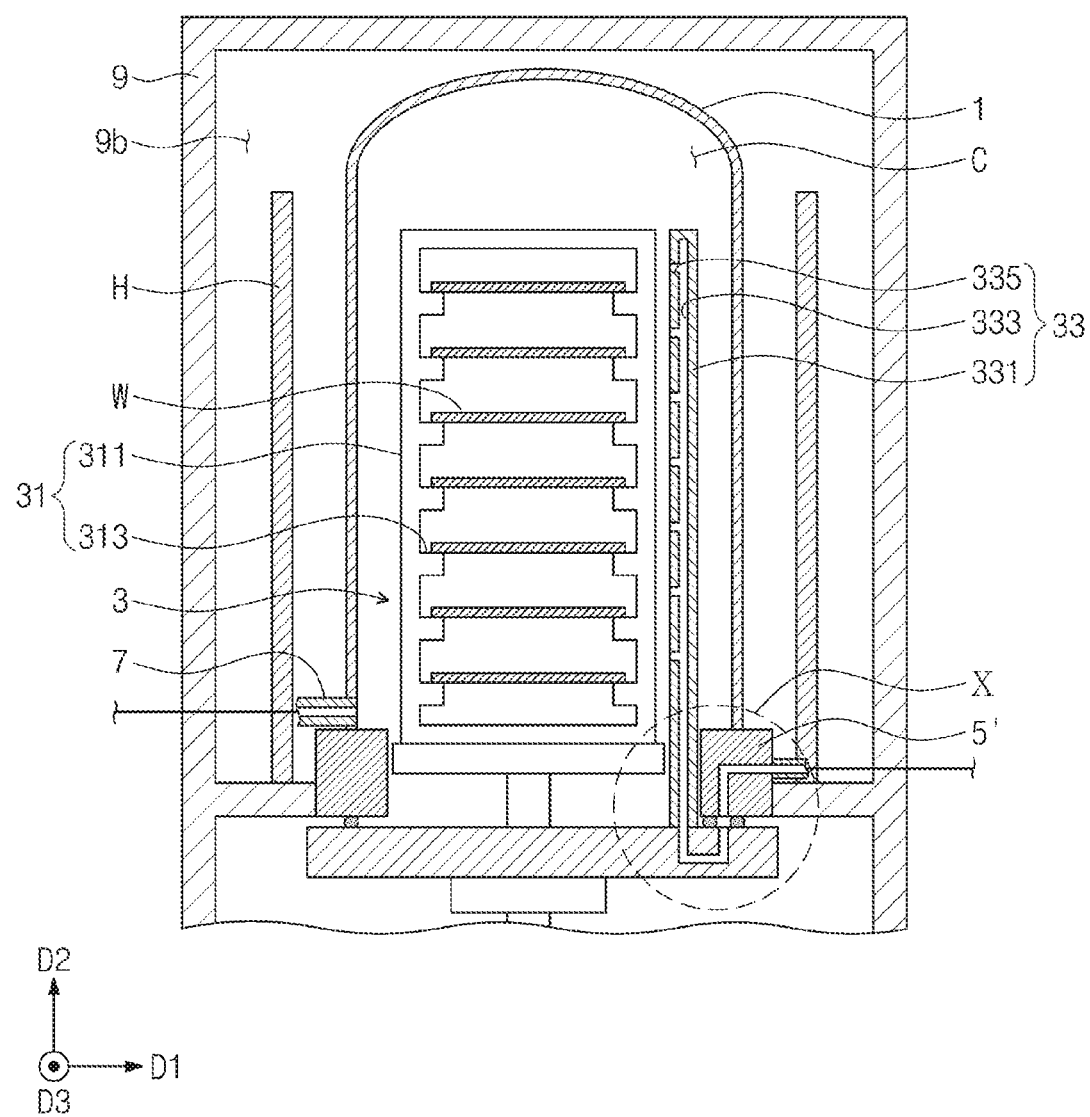
FIG. 9 is a sectional view illustrating a semiconductor processing apparatus and a semiconductor processing system according to an example embodiment of the inventive concepts.

FIG. 9 is a sectional view illustrating a semiconductor processing apparatus and a semiconductor processing system according to an example embodiment of the inventive concepts.

For concise description, element previously described with reference to FIGS. 1 to 8 may be identified by similar or identical reference numbers without repeating an overlapping description thereof.

Referring to FIG. 9, the semiconductor processing apparatus may further include a coupling part 5'. The coupling part 5' may be coupled to the processing part 1. For example, the coupling part 5' may be coupled to a bottom surface of the processing part 1. The coupling part 5' may serve as a flange of the processing part 1. The processing part 1 may be robustly supported by the coupling part 5'. The processing part 1 may be supported by the housing 9 and/or the insertion part 3 via the coupling part 5'.

Figure 10:
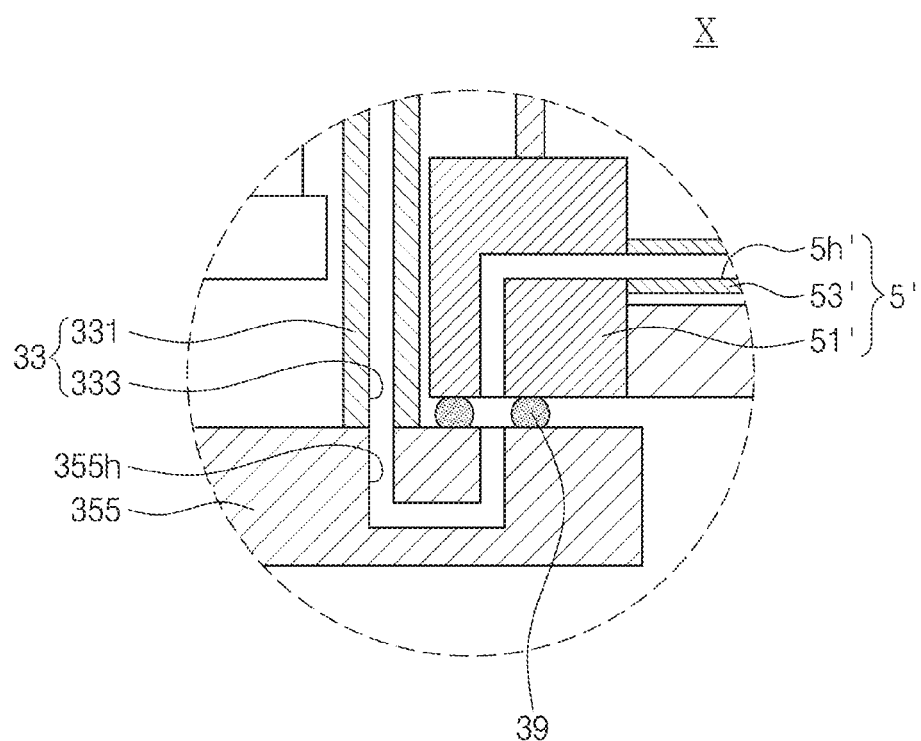
FIG. 10 is an enlarged sectional view illustrating a portion 'X' of the semiconductor processing system of FIG. 9.

FIG. 10 is an enlarged sectional view illustrating a portion 'X' of the semiconductor processing system of FIG. 9.

Referring to FIG. 10, when the insertion part 3 is inserted in the processing part 1, the coupling part 5' may be coupled to the supporting plate 355 via the second sealing member 39. The coupling part 5' may include a body 51', a gas inflow pipe 53', and a gas the inflow hole 5h'. The body 51' may support the processing part 1. As shown in FIG. 10, the body 51' may have a rectangular section, but the inventive concepts are not limited to a specific shape of the body 51'. The gas inflow pipe 53' may be coupled to a surface of the body 51'. The gas inflow pipe 53' may be a pipe-shaped structure extending in the first direction D1. The gas the inflow hole 5h' may be provided in the gas inflow pipe 53' and the body 51'. The gas the inflow hole 5h' may be fluidically connected to the connecting hole 355h. The connecting hole 355h may be fluidically connected to the transfer hole 333 of the gas ejection pipe 33. Thus, the gas the inflow hole 5h' may be fluidically connected to the transfer hole 333.

In the semiconductor processing apparatus according to an example embodiment of the inventive concepts, even when the processing part 1 is supported by the coupling part 5', a process gas may be supplied to the processing part 1 through the coupling part 5'. In some example embodiments, the coupling part 5' may be configured to be separable from the processing part 1. The coupling part 5' may be easily replaced with a new coupling part. This may make it possible to easily perform an operation of cleaning and inspecting the coupling part 5', which is used to supply the process gas. Because the coupling part 5' is coupled to the processing part 1, parts for supplying a gaseous material may be stable against an external impact. Accordingly, it may be possible to mitigate or prevent a harmful gaseous material from being leaked and to secure safety of an operator.

Figure 11:
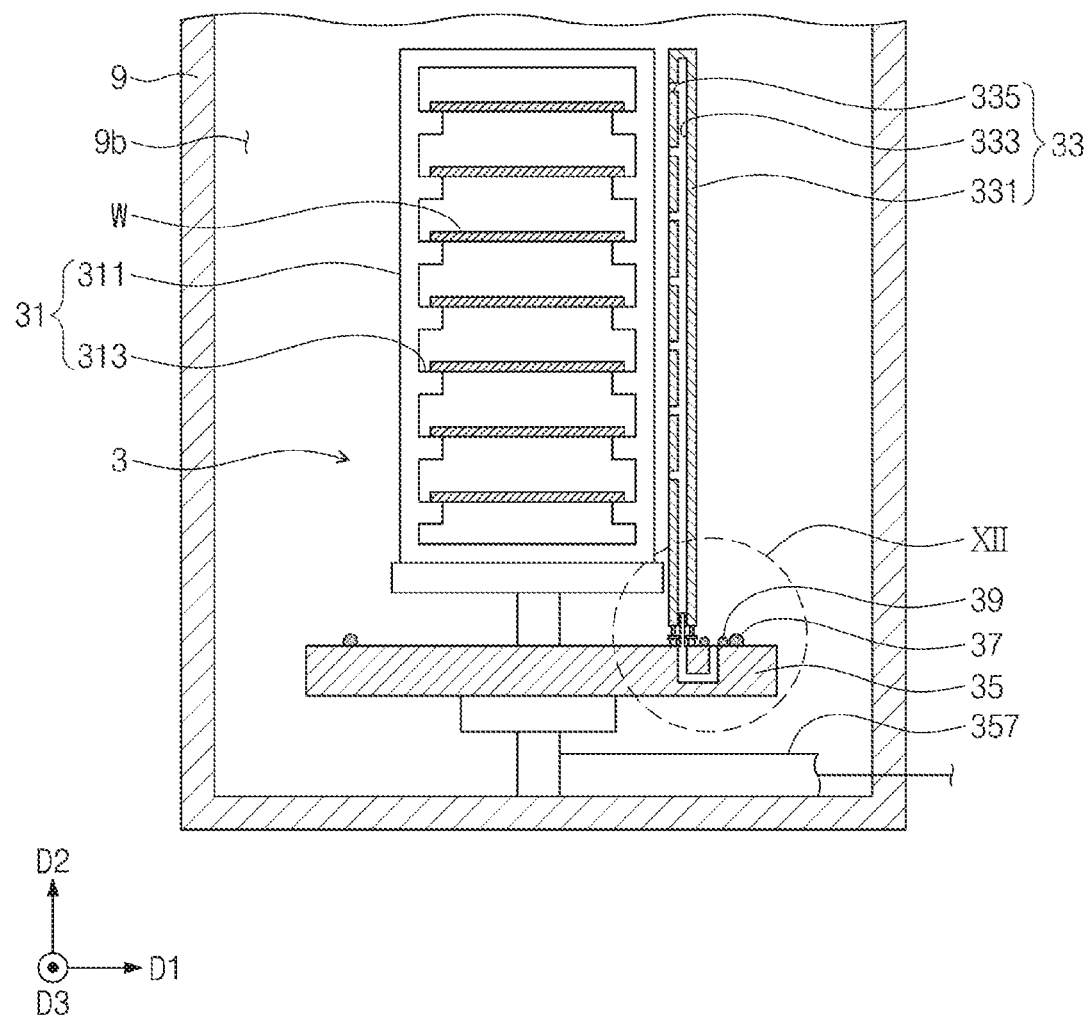
FIG. 11 is a sectional view illustrating a semiconductor processing apparatus and a semiconductor processing system according to an example embodiment of the inventive concepts.
Figure 12:
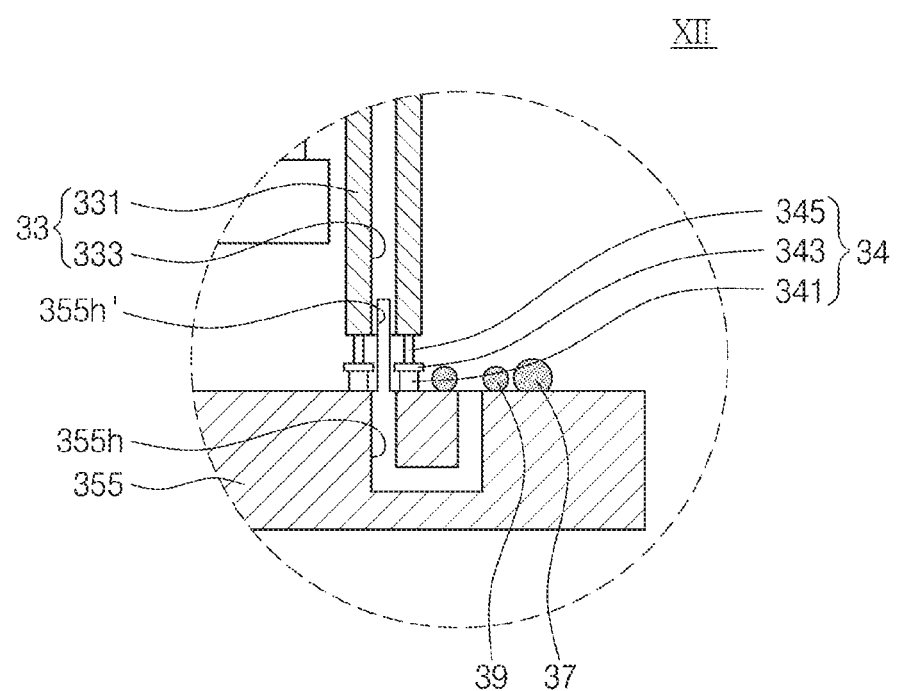
FIG. 12 is an enlarged sectional view illustrating a portion 'XII' of the semiconductor processing system of FIG. 11.

FIG. 11 is a sectional view illustrating a semiconductor processing apparatus and a semiconductor processing system according to an example embodiment of the inventive concepts, and FIG. 12 is an enlarged sectional view illustrating a portion 'XII' of the semiconductor processing system of FIG. 11.

For concise description, elements previously described with reference to FIGS. 1 to 10 may be identified by similar or identical reference numbers without repeating an overlapping description thereof.

Referring to FIG. 12, the insertion part may further include a height adjusting device 34. The height adjusting device 34 may include a supporting member 341, a height adjusting member 343, and an adjusting rod 345.

The supporting member 341 may be coupled to a top surface of the supporting plate 355. For example, the supporting member 341 may be disposed near the connecting hole 355h and on the top surface of the supporting plate 355. The supporting member 341 may support the height adjusting member 343 and the adjusting rod 345. As shown in FIG. 12, the supporting member 341 may have a rectangular section, but the inventive concepts are not limited to a specific shape of the supporting member 341.

The height adjusting member 343 may be coupled to a portion of the supporting member 341. In some example embodiments, the height adjusting member 343 may include a nut or the like. A height of the adjusting rod 345 may be adjusted by rotating the height adjusting member 343.

The adjusting rod 345 may be coupled to the height adjusting member 343. The adjusting rod 345 may be coupled to the body 331 of the gas ejection pipe 33. In other words, the adjusting rod 345 may be positioned between the height adjusting member 343 and the body 331. In some example embodiments, the adjusting rod 345 may include a screw thread. If the height adjusting member 343 rotates, a position of the adjusting rod 345 in the second direction D2 may change. Thus, a distance between the supporting plate 355 and the gas ejection pipe 33 coupled with the adjusting rod 345 may be adjusted.

The connecting hole 355h may further include an extension hole 355h'. The extension hole 355h' may be extended from the top surface of the supporting plate 355 into the transfer hole 333. Thus, even when the supporting plate 355 and the gas ejection pipe 33 are spaced apart from each other in the second direction D2 by the height adjusting device 34, a gaseous material may move from the connecting hole 355h to the transfer hole 333.

In the semiconductor processing apparatus according to an example embodiment of the inventive concepts, the height adjusting member 343 may be used to adjust a height of the gas ejection pipe 33. A height of the ejection hole 335 may be controlled. An operator may adjust alignment of the ejection hole 335 with ease. It may be possible to reduce an operation time taken to perform an alignment operation and to increase an overall process speed.

A gaseous material to be provided to a wafer may be precisely ejected to a desired position. A gaseous material may be more uniformly supplied onto a wafer or the like. This may make it possible to reduce a process variation from wafer to wafer and to improve a process yield. Furthermore, it may be possible to reduce a process cost.

In a semiconductor processing apparatus and a semiconductor processing system according to an example embodiment of the inventive concepts, an operator may align an ejection hole of a gas ejection pipe to a desired position or toward a wafer easily and precisely.

In a semiconductor processing apparatus and a semiconductor processing system according to an example embodiment of the inventive concepts, it may be possible to improve process accuracy and process uniformity and to improve a process yield.

In a semiconductor processing apparatus and a semiconductor processing system according to an example embodiment of the inventive concepts, a gas ejection pipe may be separated from a support, and this may make it possible to quickly and easily perform a process of cleaning and/or replacing the gas ejection pipe.

In a semiconductor processing apparatus and a semiconductor processing system according to an example embodiment of the inventive concepts, parts for supplying a gaseous material may be protected from an external impact, and this may make it possible to mitigate or prevent a harmful gaseous material from being leaked.

In a semiconductor processing apparatus and a semiconductor processing system according to an example embodiment of the inventive concepts, it may be possible to secure safety of an operator from a harmful gaseous material.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor processing apparatus, comprising:
a chamber including a cavity;
an insertion part configured to be inserted in the cavity; and
a gas inlet coupled to the chamber and configured to supply a gas into the cavity,
wherein the insertion part includes,
a container,
a gas ejection pipe facing the container, separated apart from the container, extending along a vertical direction, and configured to eject a gaseous material toward the container, and
a support configured to support the container and the gas ejection pipe, the support including a supporting plate, the supporting plate configured to be coupled to the gas ejection pipe and support the container, and
wherein the gas ejection pipe is further configured to ascend or descend in a state that the gas ejection pipe is coupled to the supporting plate by using a height adjusting device, and
the gas ejection pipe is coupled to the gas inlet such that an inflow hole in the gas inlet is fluidically connected to a transfer hole in the gas ejection pipe via a connecting hole in the supporting plate and an extension hole extended from a top surface of the supporting plate into the transfer hole when the gas inlet is attached to the supporting plate.

2. The semiconductor processing apparatus of claim 1, wherein
the gas inlet is configured to pass through a portion of the chamber, and
the gas ejection pipe is coupled to the gas inlet when the insertion part is inserted in the cavity.

3. The semiconductor processing apparatus of claim 2, wherein when the insertion part is inserted in the cavity, the gas ejection pipe is configured to be fluidically connected to the gas inlet.

4. The semiconductor processing apparatus of claim 3, wherein the supporting plate configured to provide a fluidic connection between the gas ejection pipe and the gas inlet when the insertion part is inserted in the cavity.

5. The semiconductor processing apparatus of claim 3, wherein
the insertion part comprises a sealing member, and
the sealing member comprises an elastically restorable material to seal the cavity when the insertion part is inserted in the cavity.

6. The semiconductor processing apparatus of claim 1, wherein the container comprises a plurality of receiving struts each configured to mount a semiconductor wafer thereon.

7. The semiconductor processing apparatus of claim 1, wherein the gas ejection pipe is configured to be detachable from the supporting plate.

8. A semiconductor processing apparatus, comprising
a chamber providing a cavity;
an insertion part configured to be inserted in the cavity; and
a flange coupled to the chamber and including a gas inlet,
wherein the insertion part includes,
a container,
a gas ejection pipe facing the container, separated apart from the container, extending along a vertical direction, and configured to eject a gaseous material toward the container, and
a supporting plate configured to support the container and the gas ejection pipe, and
wherein the gas ejection pipe is further configured to ascend or descend in a state that the gas ejection pipe is coupled to the supporting plate by using a height adjusting device,
the gas ejection pipe is coupled to the gas inlet such that an inflow hole in the gas inlet is fluidically connected to a transfer hole in the gas ejection via a connecting hole in the supporting plate and an extension hole extended from a top surface of the supporting plate into the transfer hole when the gas inlet is attached to the supporting plate.

9. The semiconductor processing apparatus of claim 8, wherein the flange is coupled to a bottom of the chamber.

10. The semiconductor processing apparatus of claim 9, wherein the gas ejection pipe is fluidically coupled to the gas inlet when the insertion part is inserted in the cavity.

11. The semiconductor processing apparatus of claim 10, wherein when the insertion part is inserted in the cavity, the gas ejection pipe is configured to be connected to the gas inlet.

12. The semiconductor processing apparatus of claim 11, wherein the supporting plate configured to provide a fluidic connection between the gas ejection pipe and the gas inlet when the insertion part is inserted in the cavity.

13. A semiconductor processing system, comprising:
a semiconductor processing apparatus; and
a housing configured to accommodate the semiconductor processing apparatus therein,
wherein the semiconductor processing apparatus includes,
a chamber including a cavity,
an insertion part configured to be inserted in the cavity, and
a gas inlet coupled to the chamber, configured to pass through a portion of the chamber, and configured to supply a gas into the cavity, and
wherein the insertion part includes,
a container,
a supporting plate configured to support the container and a gas ejection pipe, and
the gas ejection pipe facing the container, separated and spaced apart from the container, and extending along a vertical direction, the gas ejection pipe configured to eject a gaseous material toward the container, the gas ejection pipe further configured to ascend or descend in a state that the gas ejection pipe is coupled to the supporting plate by a height adjusting device, the gas ejection pipe being coupled to the gas inlet such that an inflow hole in the gas inlet is fluidically connected to a transfer hole in the gas ejection via a connecting hole in the supporting plate and an extension hole extended from a top surface of the supporting plate into the transfer hole when the gas inlet is attached to the supporting plate.

14. The semiconductor processing system of claim 13, further comprising:
a gas supply connected to the gas inlet and configured to supply the gas.

15. The semiconductor processing system of claim 13, further comprising:
a motor connected to the insertion part and configured to move the insertion part into and out of the cavity.

16. The semiconductor processing system of claim 13, wherein the housing comprises:
a first chamber configured to include the chamber; and
a second chamber separated from the first chamber and configured to accommodate the insertion part to be provided into the cavity.

17. The semiconductor processing system of claim 16, wherein the insertion part comprises an elastic object.

18. The semiconductor processing system of claim 17, wherein the elastic object is configured to seal the cavity from the second chamber when the insertion part is inserted in the cavity.

19. The semiconductor processing system of claim 13, further comprising:
an exhaust connected to the cavity and configured to exhaust the gas in the cavity.

* * * * *